United States Patent
Hatcher, Jr. et al.

(10) Patent No.: US 8,313,985 B2
(45) Date of Patent: Nov. 20, 2012

(54) ATOMIC LAYER DEPOSITION ENCAPSULATION FOR POWER AMPLIFIERS IN RF CIRCUITS

(75) Inventors: Merrill Albert Hatcher, Jr., Greensboro, NC (US); Jayanti Jaganatha Rao, Jamestown, IN (US); John Robert Siomkos, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/232,330

(22) Filed: Sep. 14, 2011

(65) Prior Publication Data
US 2012/0097970 A1 Apr. 26, 2012

Related U.S. Application Data

(60) Provisional application No. 61/405,286, filed on Oct. 21, 2010.

(51) Int. Cl.
*H01L 21/56* (2006.01)
*H01L 23/29* (2006.01)
(52) U.S. Cl. ........... 438/127; 257/E21.502; 257/788; 257/E23.118; 330/307
(58) Field of Classification Search .......... 330/250, 330/277, 207 P, 307; 438/124, 126, 127; 257/788, E23.117, E21.502, E23.118; 977/891
See application file for complete search history.

(56) References Cited

U.S. PATENT DOCUMENTS

| | | | | |
|---|---|---|---|---|
| 6,348,679 | B1 * | 2/2002 | Ryan et al. | 219/634 |
| 6,600,142 | B2 * | 7/2003 | Ryan et al. | 219/634 |
| 6,617,557 | B1 * | 9/2003 | Ryan et al. | 219/634 |
| 6,771,070 | B2 * | 8/2004 | Lee | 324/318 |
| 6,856,007 | B2 * | 2/2005 | Warner | 257/678 |
| 7,268,426 | B2 * | 9/2007 | Warner et al. | 257/707 |
| 7,863,090 | B2 * | 1/2011 | Eichelberger et al. | 438/106 |
| 8,034,664 | B2 * | 10/2011 | Kwon et al. | 438/118 |
| 2003/0143319 | A1 * | 7/2003 | Park et al. | 427/64 |
| 2008/0119098 | A1 * | 5/2008 | Palley et al. | 442/64 |
| 2008/0315377 | A1 * | 12/2008 | Eichelberger et al. | 257/660 |
| 2009/0310317 | A1 * | 12/2009 | Horten et al. | 361/752 |
| 2010/0059879 | A1 * | 3/2010 | Bielen | 257/712 |
| 2010/0164079 | A1 * | 7/2010 | Dekker et al. | 257/676 |
| 2011/0045209 | A1 * | 2/2011 | Seleznev | 427/597 |
| 2011/0298545 | A1 * | 12/2011 | Morimoto et al. | 330/296 |
| 2012/0091855 | A1 * | 4/2012 | Hatcher et al. | 310/313 C |
| 2012/0097970 | A1 * | 4/2012 | Siomkos et al. | 257/76 |

* cited by examiner

*Primary Examiner* — Mary Wilczewski
(74) *Attorney, Agent, or Firm* — Withrow & Terranova, P.L.L.C.

(57) ABSTRACT

Power amplifiers and methods of coating a protective film of alumina ($Al_2O_3$) on the power amplifiers are disclosed herein. The protective film is applied through an atomic layer deposition (ALD) process. The ALD process can deposit very thin layers of alumina on the surface of the power amplifier in a precisely controlled manner. Thus, the ALD process can form a uniform film that is substantially free of free of pin-holes and voids.

28 Claims, 18 Drawing Sheets

ATOMIC LAYER DEPOSITION ENCAPSULATION FOR POWER AMPLIFIERS IN RF CIRCUITS

RELATED APPLICATIONS

This application claims the benefit of provisional patent application Ser. No. 61/405,286, filed Oct. 21, 2010, the disclosure of which is hereby incorporated herein by reference in its entirety. This application is also related to a concurrently filed utility application entitled Atomic Layer Encapsulation for Acoustic Wave Devices, the disclosure of which is incorporated herein by reference in its entirety.

FIELD OF THE DISCLOSURE

This disclosure relates to power amplifiers with protective coatings and methods of forming the protective coating on the power amplifiers.

BACKGROUND

Power amplifiers are found in a variety of industrial, commercial, and consumer electronic products. For example, power amplifiers are utilized in mobile phones, laptops, wireless router, audio applications that drive loudspeakers, in radio frequency (RF) circuits, including the RF circuits found in mobile phones, and in computer equipment. Typically, the power amplifier is found operating between a source device and a destination device that form part of an electronic product. Often, a source device does not provide signals at a high enough signal level for use by a destination device. Thus, power amplifiers may be provided between source devices and destination devices so that signals from the source device can be amplified and received by the destination device at the appropriate signal levels.

Power amplifiers are sensitive to environmental conditions, particularly moisture, and thus need to be protected to maintain them working efficiently. Protective films are often provided to cover the power amplifier and thereby prevent moisture and other contaminants from causing damage. Unfortunately, current deposition techniques, such as sputtering deposition processes and chemical vapor deposition (CVD) processes, are not capable of depositing the protective material that forms the film in a substantially uniform manner. For instance, sections on the surface of the power amplifier and other related circuitry may have high aspect ratios and create shadowed areas that do not receive as much protective material during sputtering deposition processes or the CVD processes. These shadowed areas may leave voids and pin-holes in the protective film that expose the power amplifier to moisture and other environmental conditions. The moisture that enters through these pin-holes and voids can interfere with the operation of the power amplifier, damage the electronic components in the power amplifier, and can eventually render the power amplifier inoperable.

The high currents experienced by power amplifiers makes them particularly vulnerable to the problems caused by moisture relative to other types of electronic devices. These high currents magnify the detrimental effects of moisture penetrating the circuit component. Thus, finding a solution that can adequately deal with the fine contour features associated with the fabrication of a power amplifier during wafer fabrication is particularly important.

Thus, what are needed are better methods of applying a protective coating on a power amplifier that better conforms to the varying surfaces and fine contour features of the power amplifier.

SUMMARY

The disclosure relates to power amplifiers coated with a protective film of alumina ($Al_2O_3$) and an atomic layer deposition (ALD) process for coating the protective film on a surface of the power amplifier. The ALD process can deposit very thin layers of alumina on the surface of the power amplifier in a precisely controlled manner. Thus, the ALD process can form a uniform film that is substantially free of free of pin-holes and voids.

To coat the power amplifier with the film of alumina, the surface of the power amplifier may be hydroxylated within a reaction chamber. Once the surface of the power amplifier has been hydroxylated, a film may be deposited over the surface of the power amplifier utilizing an ALD process. Each layer deposition cycle of the ALD process may deposit a layer of the film that is as thin as a single monolayer. During each of the layer deposition cycles, a first precursor is introduced into the reaction chamber. In one embodiment, the first precursor is a trimethyaluminum gas ($Al(CH_3)_3$) and reacts with a surface that has been hydroxylated to form a monolayer of methylaluminoxane ($OAl(CH_3)_2$). In the initial layer deposition cycle, the surface that reacts with the first precursor is the surface of the power amplifier. In subsequent layer deposition cycles, the surface that reacts with the first precursor is the surface of the monolayer formed by an earlier layer deposition cycle.

After introducing the first precursor within the reaction chamber and during a second time period of the layer deposition cycle, the reaction chamber may be cleaned to remove excess amounts of the trimethyaluminum gas and any byproducts of the reaction. Next, a second precursor, such as water vapor ($H_2O$), is introduced into the chamber during a third time period of the layer deposition cycle. The second precursor reacts with the methyaluminoxane of the monolayer so that the monolayer is made of alumina. After the reaction, the alumina in this monolayer is bonded to hydroxyl (OH) so that the surface of the monolayer is hydroxylated. During a fourth time period of the layer deposition cycle, the reaction chamber may again be cleaned to remove excess amounts of unreacted water vapor and the byproducts of the second reaction. By repeating the above described process, the film may be built one monolayer at a time to a desired thickness.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Power amplifiers are devices that change, typically increase, the amplitude of an input signal to generate an amplified output signal. The input signal and the output signal may be a current or a voltage. The relationship between the amplitude of the input signal and the amplitude of the amplified output signal is referred to as the transfer function of the power amplifier and the magnitude of the transfer function is often referred to as the gain. The transfer function of the power amplifier may be simple such as when the gain of the transfer function can be expressed as a constant. In this case, the magnitude of the amplified output signal that is generated by the power amplifier may be approximately equal to the amplitude of the input signal multiplied by the constant. On the other hand, the transfer function of the power amplifier may be much more complex, non-linear, and/or dependent on a plurality of different parameters. For example, the transfer function may be frequency dependent and the gain may vary in accordance with a frequency of the input signal. Power amplifiers may have various frequency ranges of operation (i.e., audio, intermediate frequency (IF), very high frequency (VHF), radio frequency (RF), microwave frequency, etc.), and various types of electronic components may be utilized in the power amplifier to provide amplification (valve, tube amplifiers, field effect transistor (FET) amplifiers, bipolar junction transistor (BJT) amplifiers, etc.). This disclosure is not limited to any particular electronic topology for a power amplifier. Rather, any type of power amplifier is within the scope of this disclosure so long as the power amplifier needs or could benefit from a film to protect the power amplifier. For example, power amplifiers may be utilized in a mobile phone, laptop, an electric guitar, a radio, with a loudspeaker, in a transmitter, in a receiver, in a transceiver, etc.

Figure 1:
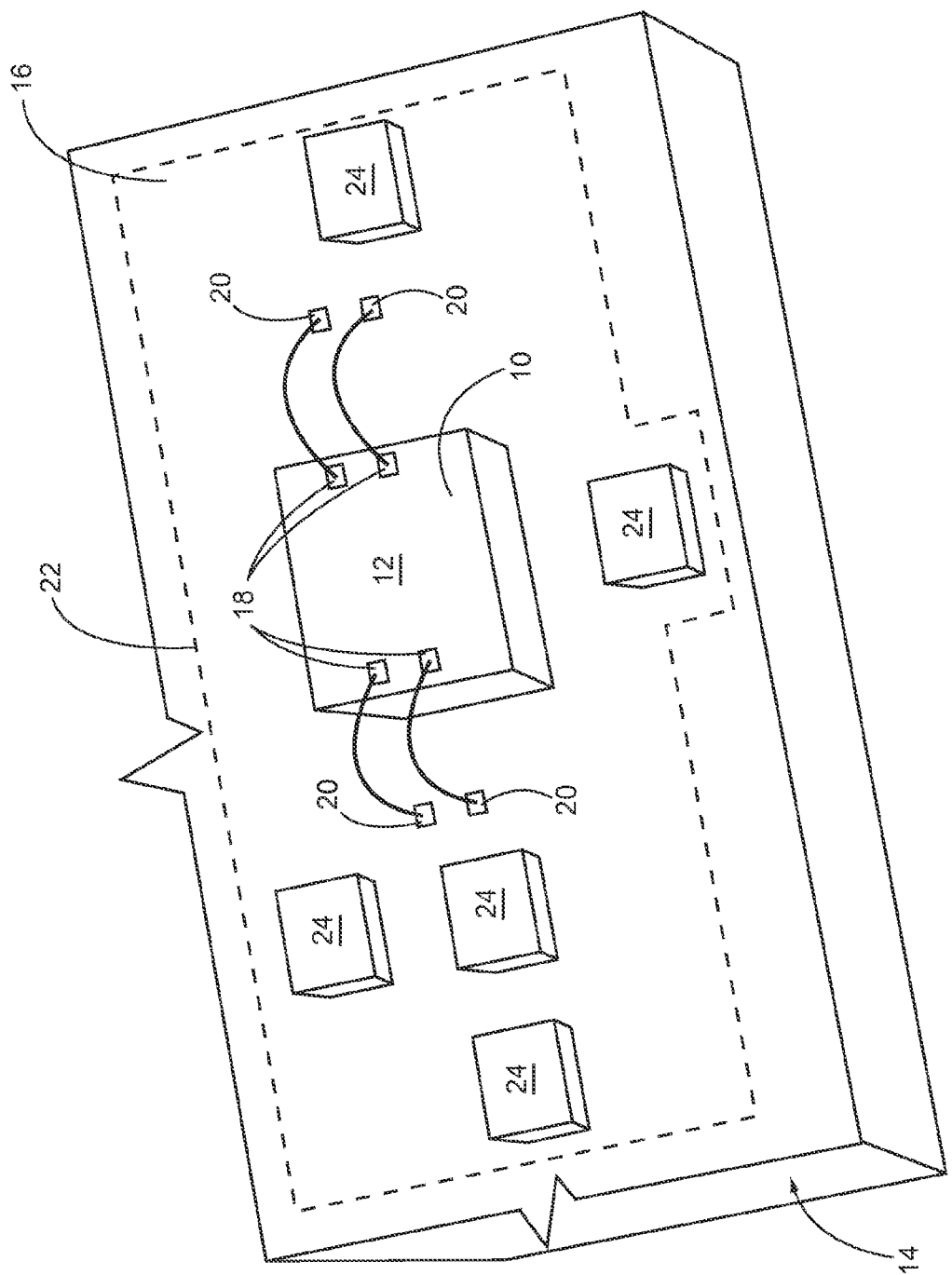
FIG. 1 is a perspective view of one embodiment of a power amplification circuit having a power amplifier that has been attached on a substrate surface of a laminated substrate.

FIG. 1 illustrates one embodiment of a power amplifier 10. In this example, the power amplifier 10 has been formed in a semiconductor die 12. Thus, the power amplifier 10 shown in FIG. 1 may be formed by one or more electronic components, such as transistors, formed by the semiconductor die 12. A laminated substrate 14 has a substrate surface 16 and the power amplifier 10 is attached on the substrate surface 16 of the laminated substrate 14. The laminated substrate 14 may be any type of laminate utilized to support electronic components such as, for example, FR-1, FR-2, FR-3, FR-4, FR-5, FR-6, CEM-1, CEM-2, CEM-3, CEM-4, CEM-5, and the like.

In this embodiment, the power amplifier 10 includes conductive pads 18 that have been formed on the semiconductor die 12 and are wire bonded to conductive pads 18 on the substrate surface 16. The power amplifier 10 may receive one or more input signals, transmit one or more amplified output signals, receive power, connect to ground, and/or receive control signals on the conductive pads 18. The conductive pads 18 on the substrate surface 16 may provide connections to other electronic devices. In alternative embodiments, the semiconductor die 12 may not include the conductive pads 18 or wire bonds but rather connections to the power amplifier 10 may be provided through other connection techniques, such as flip chip die, metallic traces formed on or inside the laminated substrate 14, vertical interconnect access structures (vias), and the like.

A power amplification system 22 that includes the power amplifier 10 and ancillary power electronic devices 24 has been assembled on the laminated substrate 14 shown in FIG. 1. The power amplifier 10 operates in conjunction with the ancillary power electronic devices 24 in order to provide amplification in accordance with the performance characteristics desired by a source device and/or destination device. In this embodiment, the ancillary power electronic devices 24 have been attached on the substrate surface 16 of the laminate. The ancillary power electronic devices 24 may include control systems, attenuators, filtering circuitry, impedance matching circuitry, gain control circuitry, voltage sources, and the like. Some of these ancillary power electronic devices 24 may be formed on their own semiconductor dies.

Note, the laminated substrate 14 may be utilized as a circuit board and other electronic devices (not shown) not directly associated with the power amplifier 10 may also be assembled on the laminated substrate 14, if desired. For example, RF circuits, microprocessors, power supplies, heat sinks, and other circuitry may also be provided on the laminated substrate 14. Alternatively, in some embodiments of the power amplifier 10, the ancillary power electronic devices 24 may not be provided on the laminated substrate 14 but may instead be provided by external electronic components. Other embodiments of the power amplifier 10 may not require ancillary power electronic devices 24 at all or one or more of the ancillary power electronic devices 24 may be provided in the power amplifier 10 by being formed in the semiconductor die 12.

Figure 2:
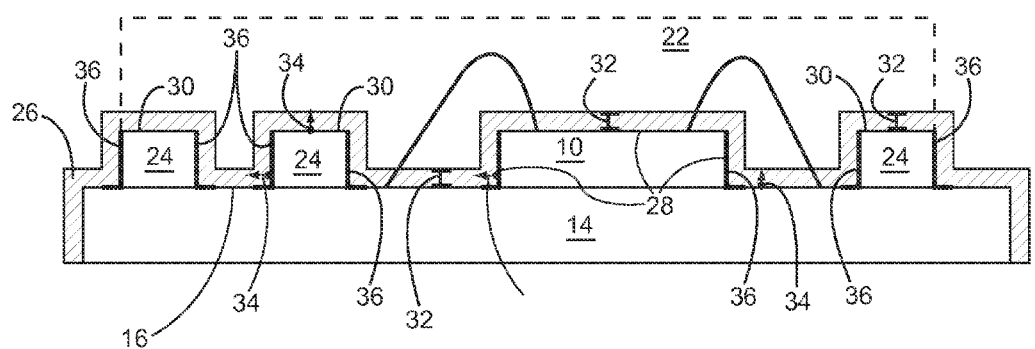
FIG. 2 is a cross-sectional view of the power amplification circuit shown in FIG. 1 that has been attached to the laminated substrate and formed to have a film of alumina on the power amplifier and over the substrate surface.

FIG. 2 is a cross-sectional view of the laminated substrate 14 and shows that a film 26 has been formed over the substrate surface 16. The film 26 that covers the power amplification system 22 is provided on a surface 28 of the power amplifier 10 and on surfaces 30 of the ancillary power electronic devices 24. The film 26 is made of alumina ($Al_2O_3$) and thus provides an effective environmental barrier that protects the power amplifier 10 and the ancillary power electronic devices 24 from moisture. The film 26 in this example is conformal in that the film conforms to the shape of the material on which it sits.

A thickness 32 of the film 26 may be provided to be substantially uniform along the substrate surface 16, the surface 28 of the power amplifier 10, and the surfaces 30 of the ancillary power electronic devices 24 meaning that a distance normal 34 to the surface plane and the top of the film 26 is substantially the same along the substrate surface 16, the surface 28 of the power amplifier 10, and the surfaces 30 of the ancillary power electronic devices 24. The thickness 32 of the film may depend on the protection required by the power amplifier 10, in addition to factors such as manufacturing time, the particular topology, and function of the power amplifier 10. However, the thickness 32 of 50 Angstroms and 300 Angstroms is very thin relative to the capabilities of other deposition processes, such as sputtering deposition processes and chemical vapor deposition (CVD) processes, while generally being thick enough to protect the power amplifier 10.

As shown in FIG. 2, the different structures of the power amplifier 10 may cause the substrate surface 16, the surface 28 of the power amplifier 10, and the surfaces 30 of the ancillary power electronic devices 24 have different vertical levels. In turn, this may cause shadow areas 36, since these shadow areas 36 are at least partially obscured by the structures on the substrate surface 16, the surface 28 of the power amplifier 10, and the surfaces 30 of the ancillary power electronic devices 24 because these structures are on different vertical levels. However, the thickness 32 of the film 26 on the shadow areas 36 remains substantially uniform with the thickness 32 of the film 26 on other unshadowed sections along the substrate surface 16, the surface 28 of the power amplifier 10, and the surfaces 30 of the ancillary power electronic devices 24.

An Atomic Layer Deposition (ALD) process may be implemented to deposit the film 26 on the substrate surface 16, the surface 28 of the power amplifier 10, and the surfaces 30 of the ancillary power electronic devices 24. An embodiment of the ALD process is discussed below that deposits the film 26 uniformly despite the presence of the shadow areas 36 so that the film 26 is substantially devoid of pin-holes, voids, or areas without sufficient protective material due to the uniformity. In this embodiment, the film 26 has been coated on the surface 28 of the power amplifier 10 after the power amplifier 10 has been attached on substrate surface 16 and thus the film 26 covers the power amplification system 22. However, this may not be the case.

Figure 3:
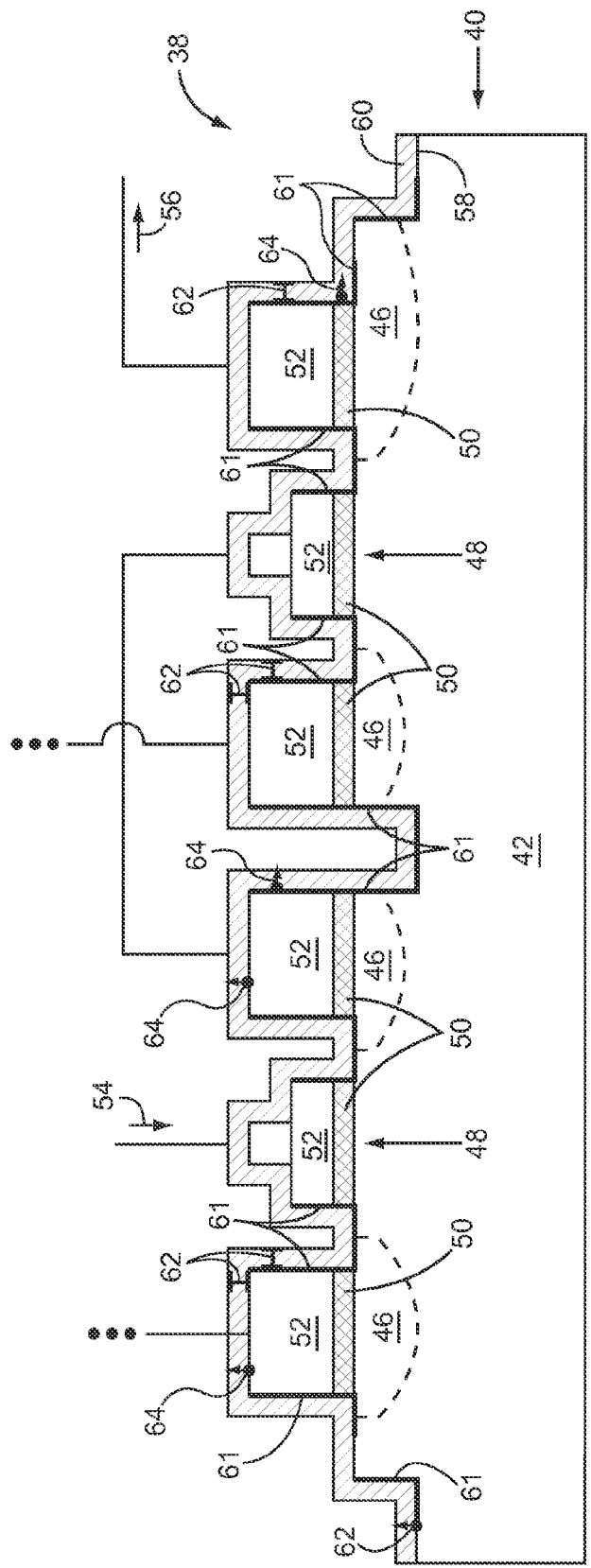
FIG. 3 is a cross-sectional view of another embodiment of a power amplifier having a film of alumina on a surface of the power amplifier.

FIG. 3 is a cross sectional view of another embodiment of a power amplifier 38. This embodiment of the power amplifier 38 is also formed on a semiconductor die 40. The semiconductor die 40 includes a semiconductor substrate 42 and a metallic layer 44. The semiconductor substrate 42 in this embodiment is made of Gallium Arsenide (GaAs). However, the semiconductor substrate 42 may be made from any suitable semiconductive material, such as Gallium Nitride (GaN), Gallium Phosphide (GaPh), silicon (Si), Germanium (Ge), silicon germanium (SiGe), and the like.

Within the semiconductor substrate 42, are doped regions 46 that may form one or more transistors 48. The transistors 48 in this example are field effect transistor (FET) devices and thus the doped regions may be associated with a gate, a drain, and a source. An insulating layer 50, made from silicon dioxide (SiO₂) or the like, may be provided between the metallic layer 44 and the insulating layer 50. The metallic layer 44 has been shaped into terminals 52 that provide connections to the transistors 48. The transistors 48 are configured to amplify an input signal 54 and generate an amplified output signal 56. In this manner, the power amplifier 38 is operable to receive the input signal 54 from a source device and provide the amplified output signal 56 to a destination device.

While the transistors 48 in FIG. 3 are FET devices, the power amplifier 38 may be any type of transistors 48, such as bipolar field effect (BJT) devices, and the like. The transistors 48 may also be configured in any desired topology to provide amplification. The type of transistors 48 utilized may depend on the desired semiconductor material of the semiconductor substrate 42 and the desired performance characteristics of the power amplifier 38. Other layers (not shown), may be provided between or below the semiconductor substrate 42 and metallic layer 44 in accordance with the particular semiconductor technology used to form the power amplifier 38.

The power amplifier 38 has a surface 58. A film 60 of alumina has been formed on the surface 58 to protect the power amplifier 38. Note that the surface 58 of the power amplifier 38 has shadow areas 61 due to the different structures of the power amplifier 38 being on different vertical levels. However, a thickness 62, as measured by a distance normal 64 from a surface plane of the surface 58 to the top plane of the film 26 is substantially uniform along the surface 58 of the power amplifier 38. The film 60 may thus be provided essentially without, pin-holes or voids, and the film 60 has about the same thickness 62 on the shadow areas 61 of the surface 58 as on unshadowed areas.

The metallic layer 44 in the embodiment illustrated in FIG. 3 are made of aluminum. Thus, protecting the power amplifier 38 with the film 60 of alumina may be advantageous since aluminum and alumina have relatively similar thermal expansion coefficients. As a result, the aluminum and the alumina expand and contract at relatively the same rate when exposed to different thermal conditions and this may thus extend the life of the film 60. However, the metallic layer 44 may be made of any suitable metallic material such as copper (Cu), gold (Au), silver (Ag), Nickel (Ni). In addition, the metallic material may also include metallic alloys or other metallic materials mixed with or forming ionic or covalent bonds with other non-metallic materials to provide a desired conductive and/or thermodynamic property.

The film 60 may be deposited on the surface 58 of the power amplifier 38 by implementing an ALD process. However, unlike the power amplifier 10 in FIG. 2, the film 60 has been deposited prior to attaching the power amplifier 38 to a supporting structure. While the discussion in this disclosure focuses on the application of the film on a single power amplifier circuit built on a single die, the discussion is equally applicable and is intended to cover the application of the film on a plurality of power amplifier circuits built on a plurality of dies at the wafer level. The film may be applied at the wafer level using the ALD process as part of the layer build up process or post processed to the finished wafer during the integrated circuit manufacturing process. Applying the film as part of the power amplifier wafer fabrication process allows for scaling up for mass producing power amplifier devices using the ALD process. It should be noted then that the ALD procedures discussed herein for the power amplifier circuit built on a die are performed either when the procedures are performed on a power amplifier circuit built on a separated die or on a power amplifier circuit built on a wafer so that the ALD process is being performed simultaneously on other power amplifier circuits (or other types of electronic devices) also built on the wafer.

In this embodiment, the power amplifier 38 may be coated with the film 60 and then attached to the supporting structure, or may be used independently without attaching the power amplifier 38 to a supporting structure. Alternatively, like the embodiment illustrated in FIG. 2, the power amplifier 38 may be attached to the desired supporting structure prior to coating the film 60 and then coated with the film 60 along with any other ancillary power amplification circuitry that may have also been attached onto the supporting structure.

Figure 4:
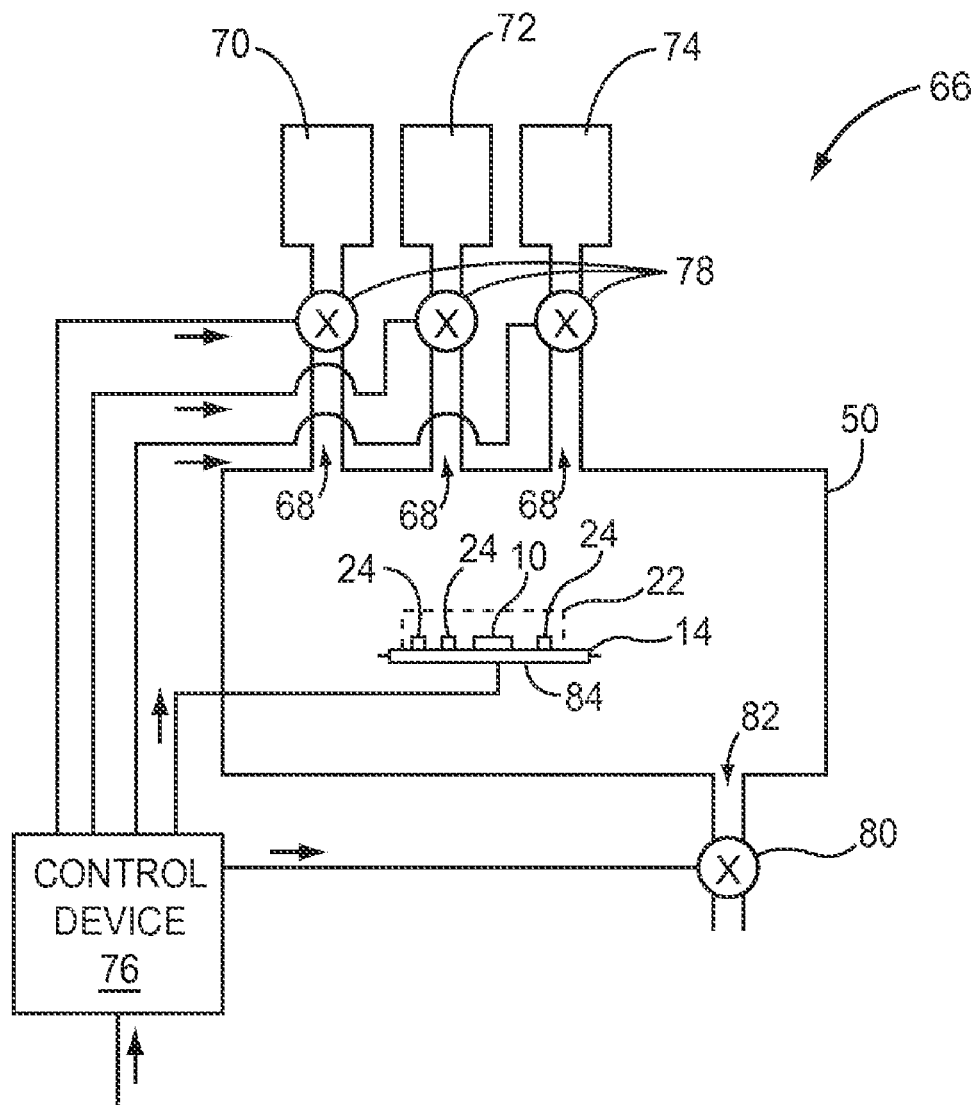
FIG. 4 illustrates one embodiment of a reaction chamber for forming the film of alumina over the substrate surface, as shown in FIG. 1.

FIG. 4 shows the power amplifier 10 provided in a reaction chamber 66 prior to forming the film 26 on the surface 28. An ALD process is performed within the reaction chamber 66 to form the film 26 over the surface 28 of the power amplifier 10, which is described below in FIGS. 5A-5N. The power amplifier 10 has been previously attached onto the substrate surface 16 along with the ancillary power electronic devices 24 and thus the laminated substrate 14 has been provided in the reaction chamber 66 as well. The ALD process deposits the film 26 over the substrate surface 16 and covers the entire power amplification system 22, including the surface 28 of the power amplifier 10. However, as discussed above, the film 26 does not have to be provided after attaching the power amplifier 10 on the substrate surface 16. For example, the power amplifier 38 may be provided in the reaction chamber 66 to implement the ALD process that forms the film 60 on the surface 58 without having been attached to a supporting structure.

Referring again to FIGS. 2 and FIG. 4, the reaction chamber 66 may have a plurality of inlets 68 each leading to different storage vessels 70, 72, 74. The first storage vessel 70 may store a first precursor, the second storage vessel 72 may store a second precursor, and the third storage vessel 74 may store an inert gas. The reaction chamber 66 may have a control device 76 that controls the flow rates of the first precursor, the second precursor, and the inert gas into the reaction chamber 66. The control device 76 may be a hardwired device or may be a computer device storing computer-executable software instructions that are executed by one or more processors to control the flow rates of the first precursor, the second precursor, and the inert gas. To do this, the control device 76 may generate control signals that are received by flow controllers 78. The flow controllers 78 determine when and how much of the first precursor, second precursor, and inert gas is introduced within the reaction chamber 66 through the inlets 68 and thus control the flow rates from the storage vessels 70, 72, 74. The control device 76 may also control a flow controller 80 for an outlet 82 of the reaction chamber 66 so that materials can exit the reaction chamber 66. For example, the flow controller 80 may open a valve to create a vacuum within the reaction chamber 66 that forces the evacuation of material from the reaction chamber 66 through the outlet 82.

The control device 76 may be configured to implement a plurality of layer deposition cycles for the ALD process, which are explained in further detail below. Each layer deposition cycle may deposit a molecular layer of alumina over the surface 28 of the power amplifier 10 and these molecular layers can be stacked over one another to form the film 26. These molecular layers may be as fine as a monolayer or up to 400 molecules in thickness. Monolayers are layers that are one molecule in thickness and thus monolayers of alumina may be less than 0.1 Angstroms in thickness. Since each layer deposition cycle may deposit a single molecular layer as thin as a monolayer, the thickness 32 of the film 26 can be controlled with great accuracy by simply determining the number of layer deposition cycles. The control device 76 may also control a heating element 84 that may be utilized to control the temperature of the laminated substrate 14 and the power amplifier 10. In this manner, the temperature of the surface 28 and also the surfaces of the molecular layers formed over the surface 28 may be provided at the appropriate temperatures for the ALD process.

As explained in further detail below, the ALD process is a surface controlled process and because of the surface control, films 26 formed by the ALD process can be very conformal and uniform in thickness 32. Also, unlike sputtering deposition processes and CVD processes, there is less need for reactant flux homogeneity, which makes it easier to scale-up the ALD process and mass produce power amplifier 10 with films 26. The films 26 may have a thickness 32 of 50 Angstroms to 300 Angstroms, which is generally sufficient thick so as to protect the power amplifier 10. However, the ALD process can provide the film 26 of any desired thickness over the surface 28 of the power amplifier 10, since the ALD process can form the film 26 one monolayer at a time. Currently, laboratory reactors deposit the monolayer in around 1 minute while manufacturing tools typically can deposit and form the monolayer in less than a second.

Due to the high current experienced by many types of power amplifiers, such as power amplifier 10, it was particularly important to find a solution that adequately protected the power amplifier 10 from moisture. It was discovered that the uniformity of the film 26 provided by the ALD process solves many of the moisture problems resulting from other deposition processes such as sputtering and CVD. Using the ALD process to provide more adequate moisture protection may significantly extend the life and performance of the power amplifier 10.

Figure 5A:
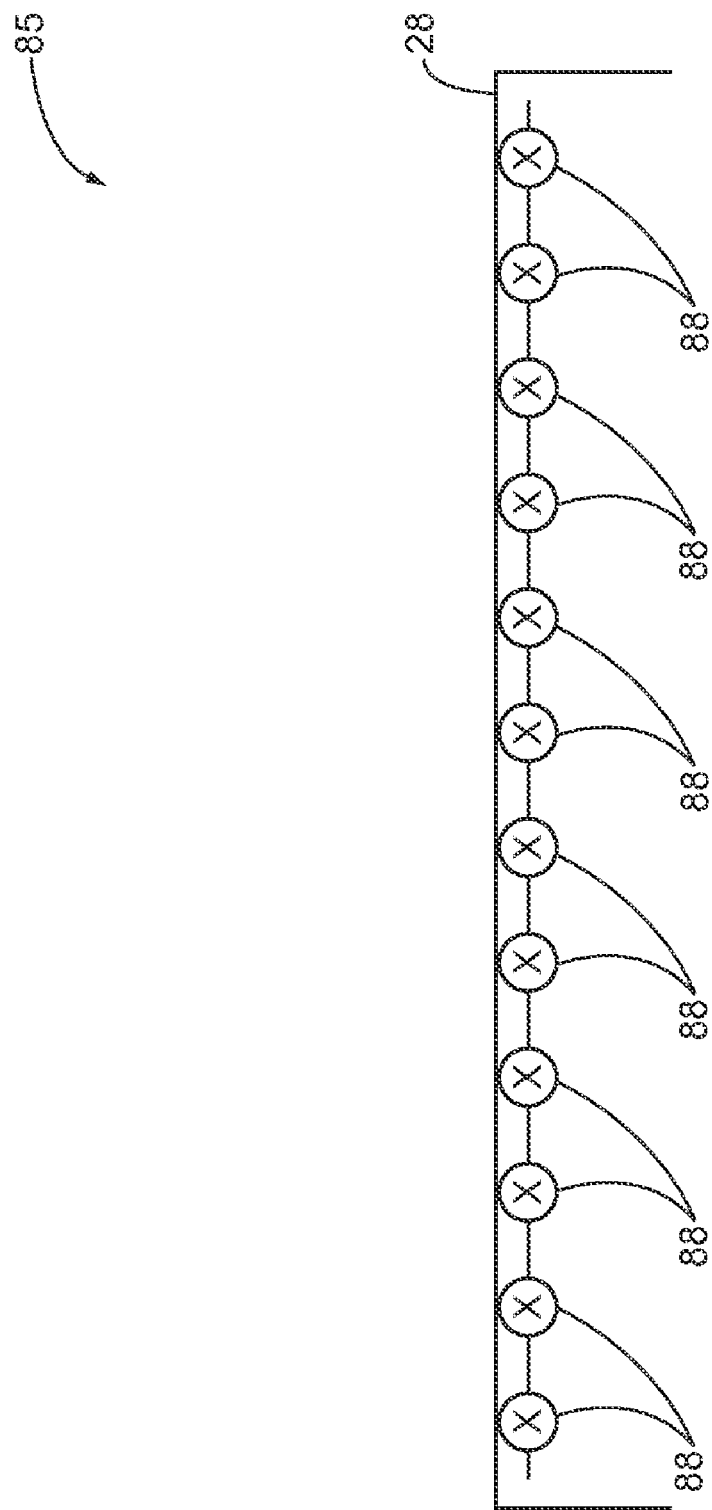
FIGS. 5A-5N illustrates procedures in one embodiment of an ALD process for forming the film on the surface of the power amplifier and over the substrate surface as shown in FIG. 2.
Figure 5B:
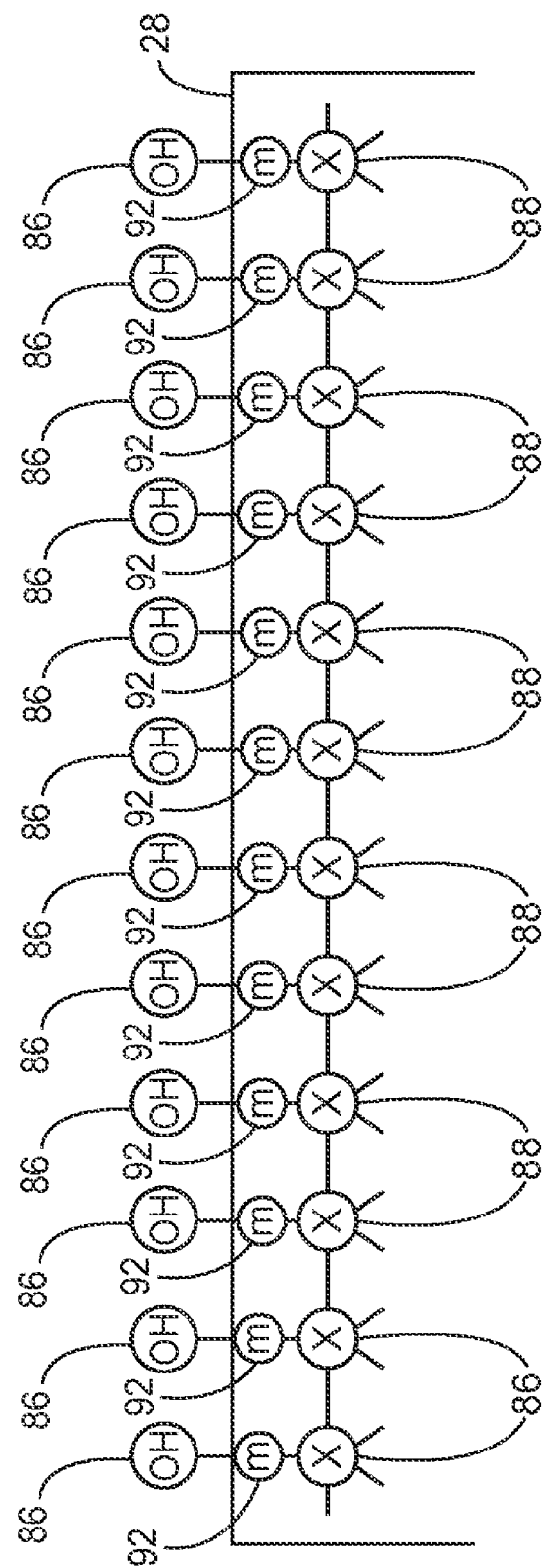
Figure 5C:
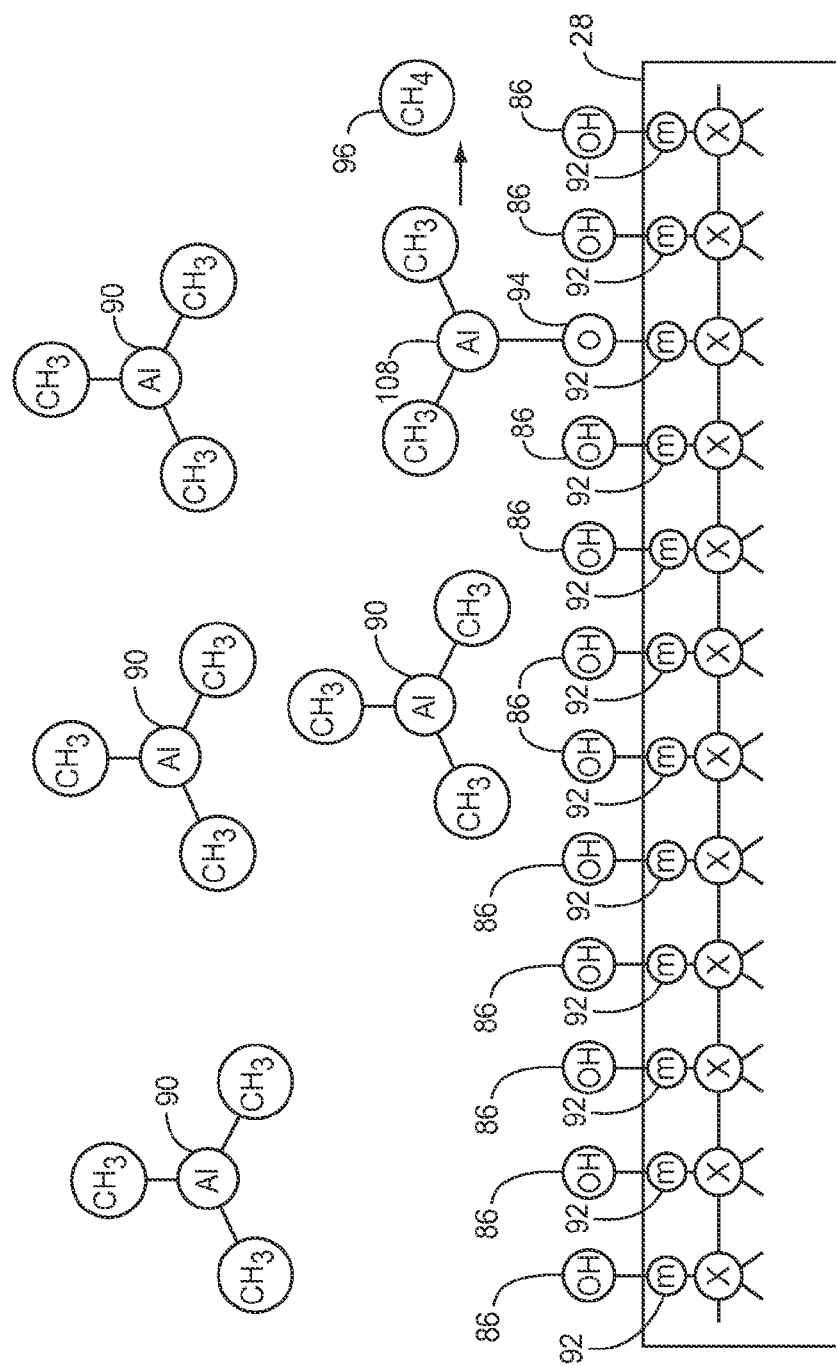
Figure 5D:
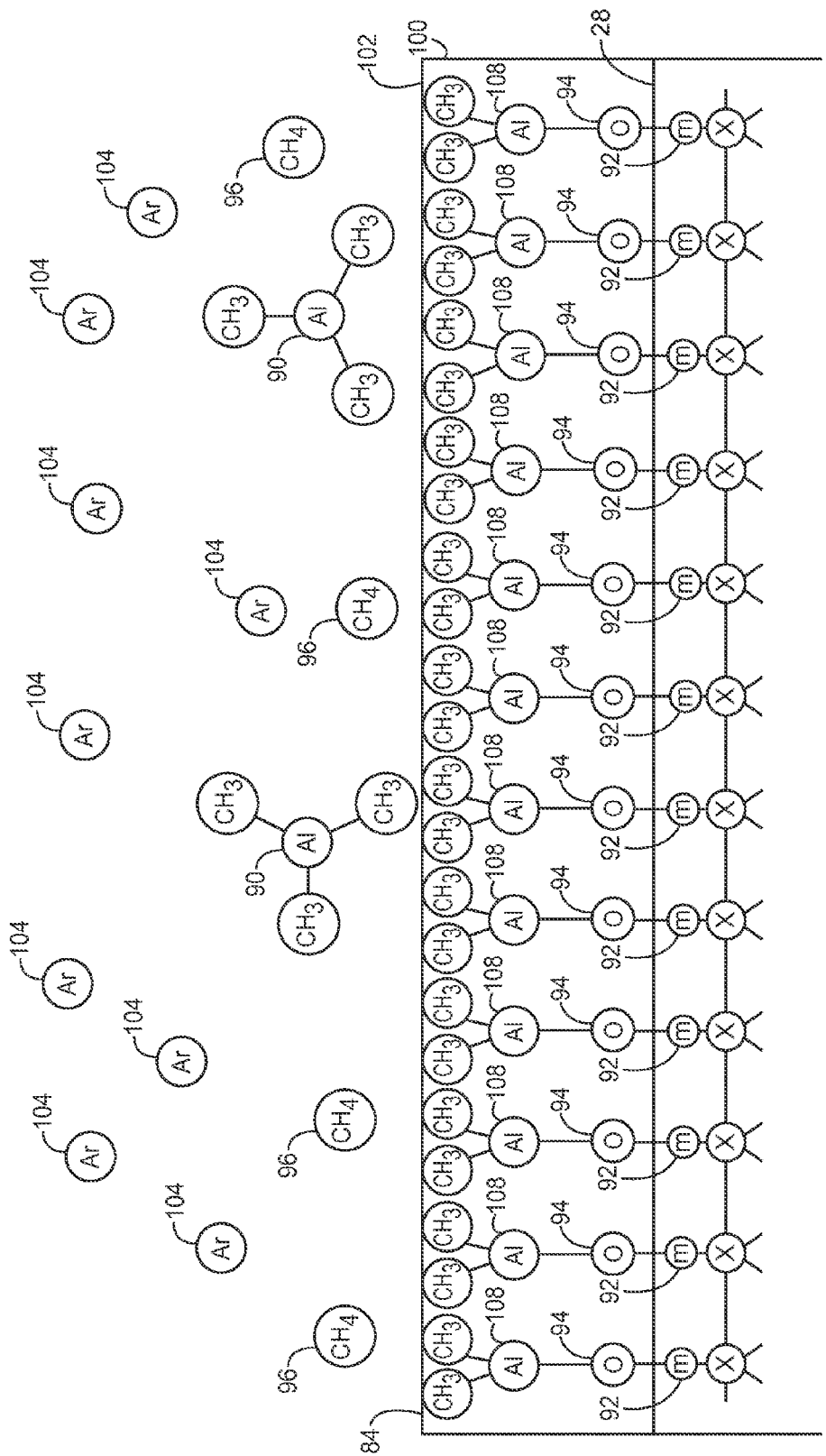
Figure 5E:
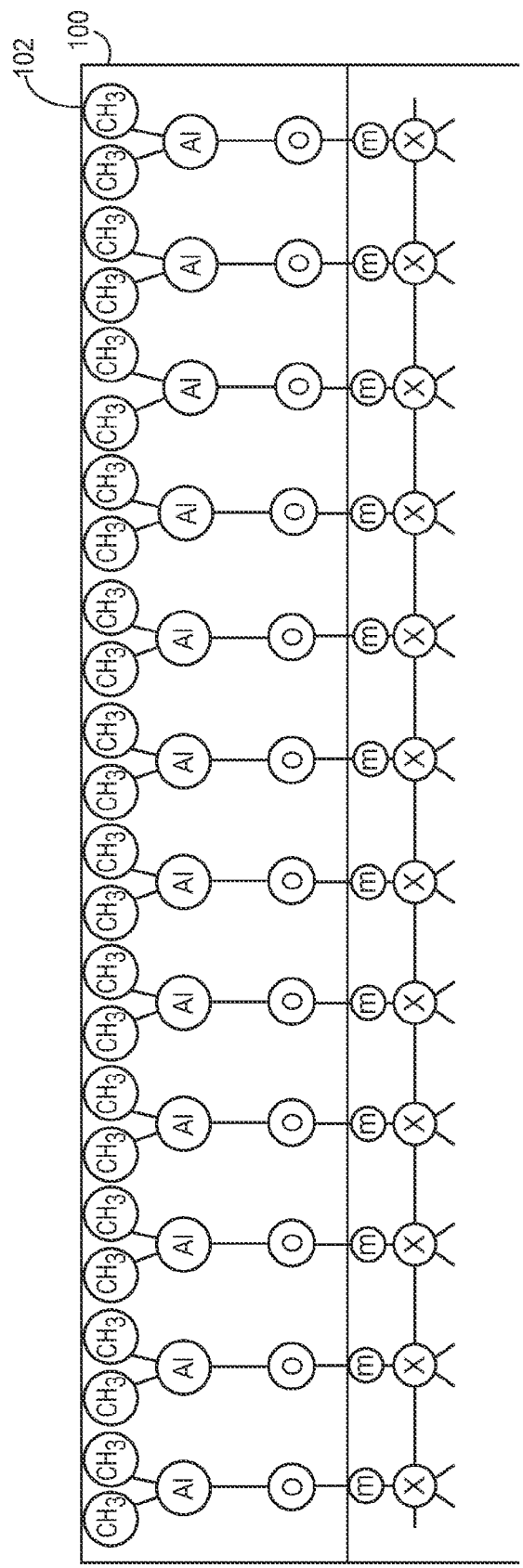
Figure 5F:
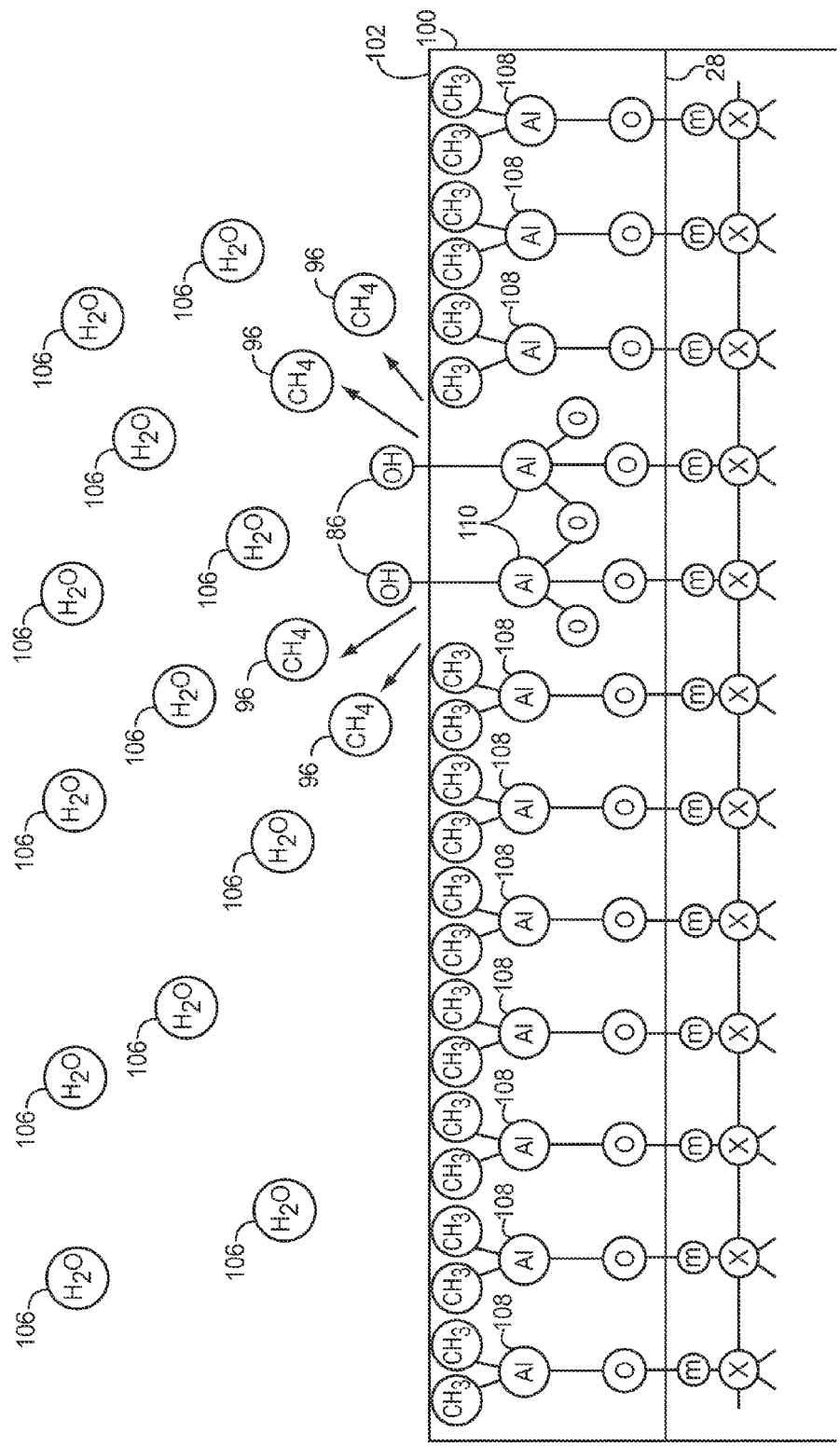
Figure 5G:
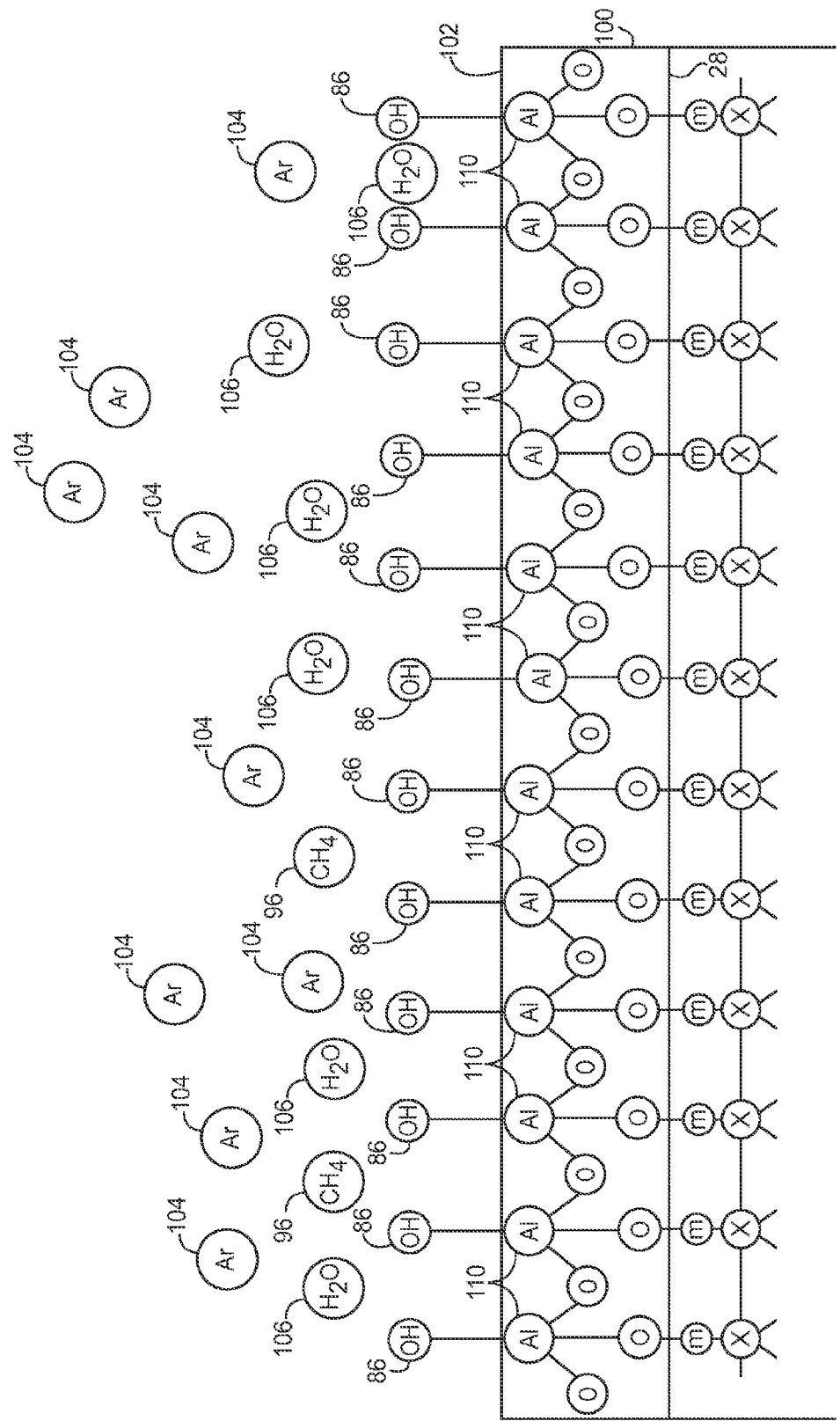
Figure 5H:
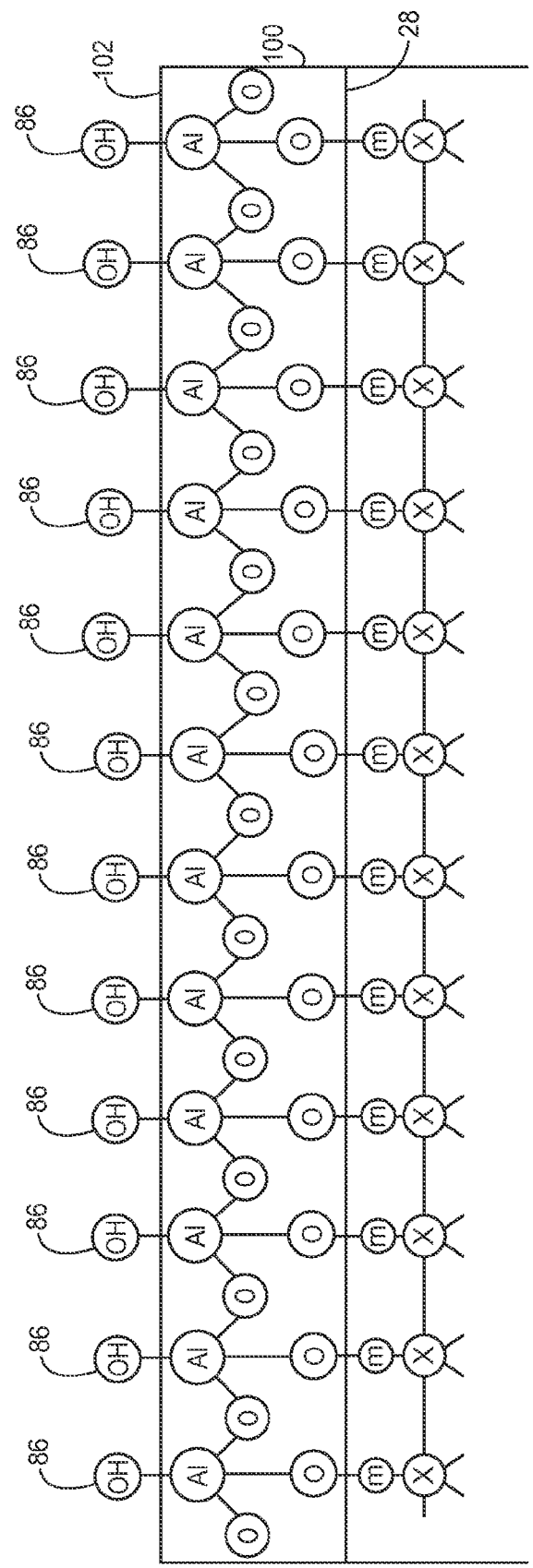
Figure 5I:
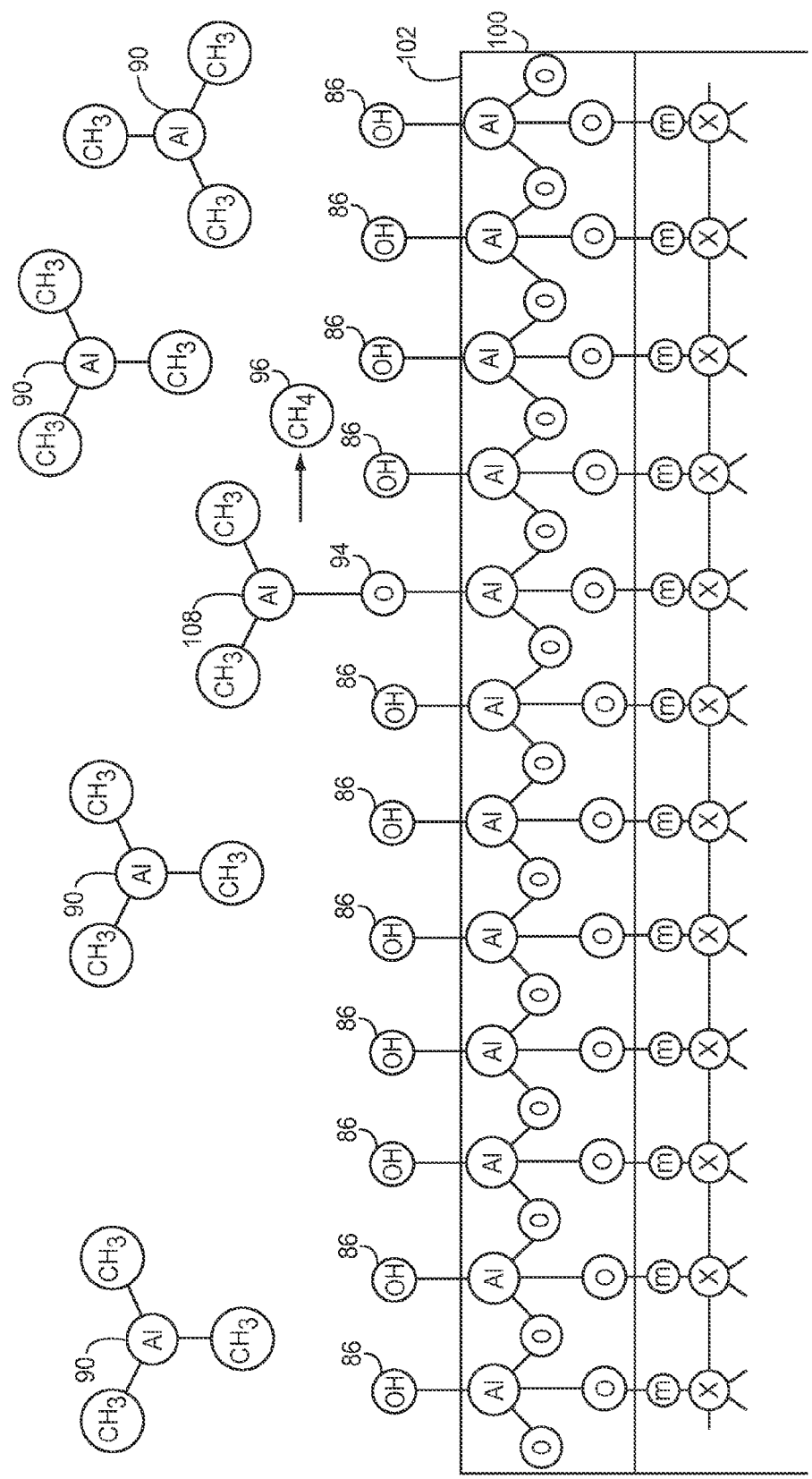
Figure 5J:
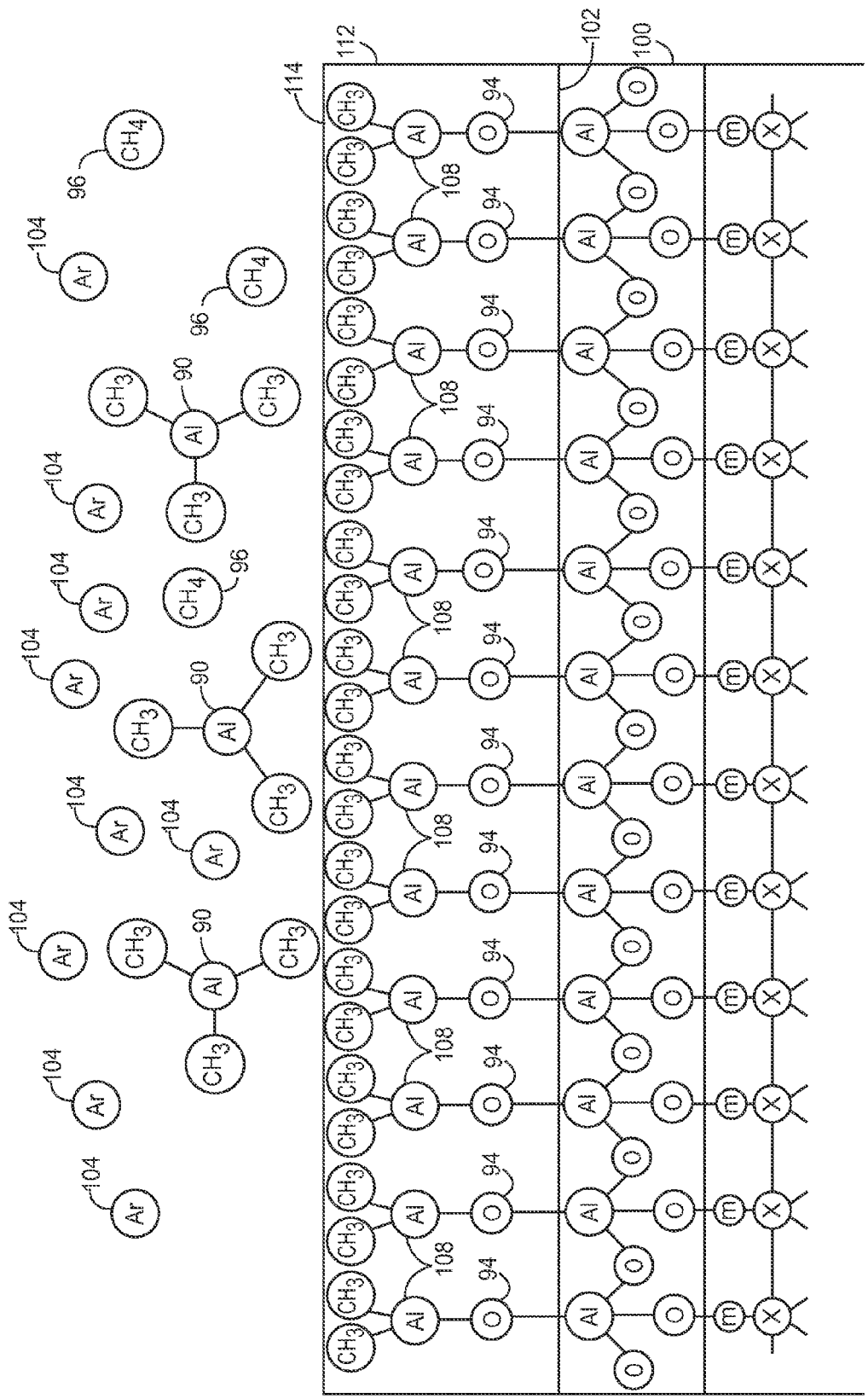
Figure 5K:
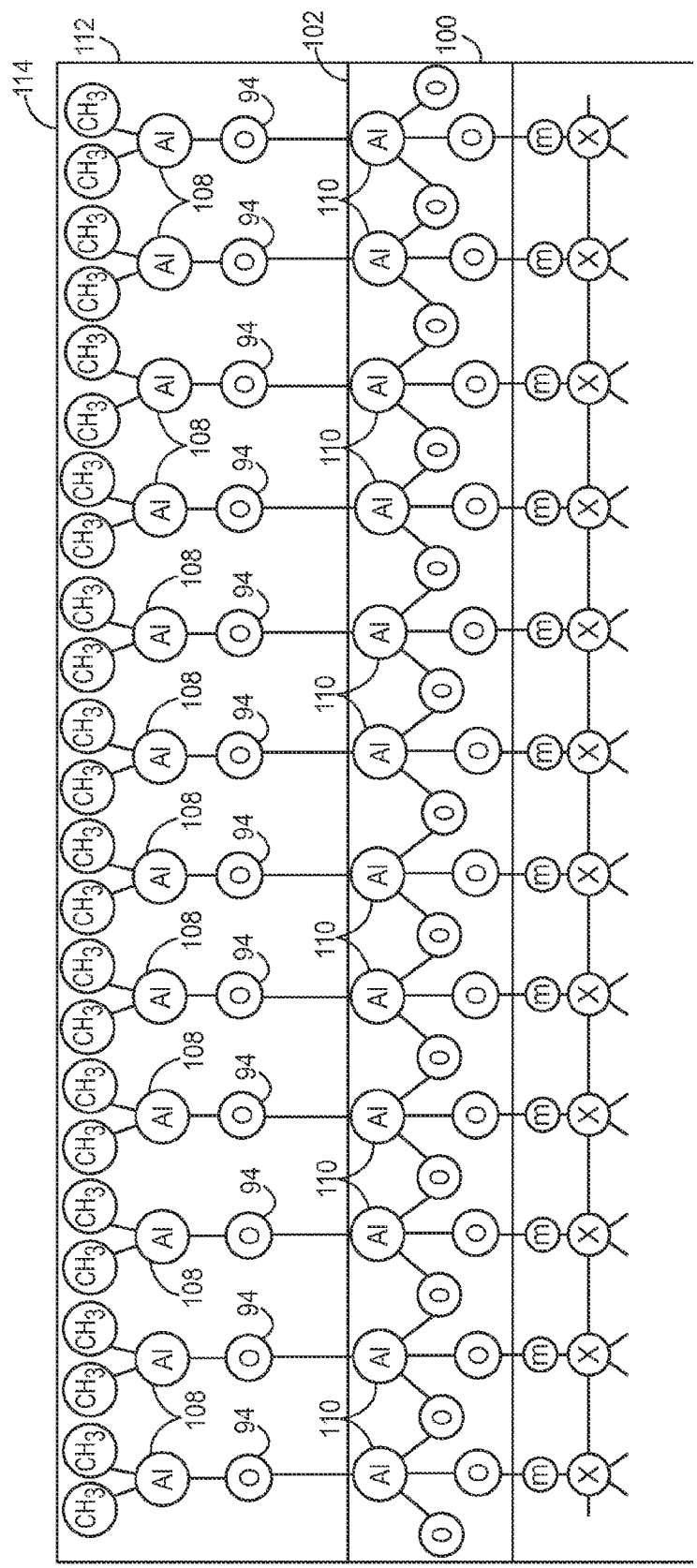
Figure 5L:
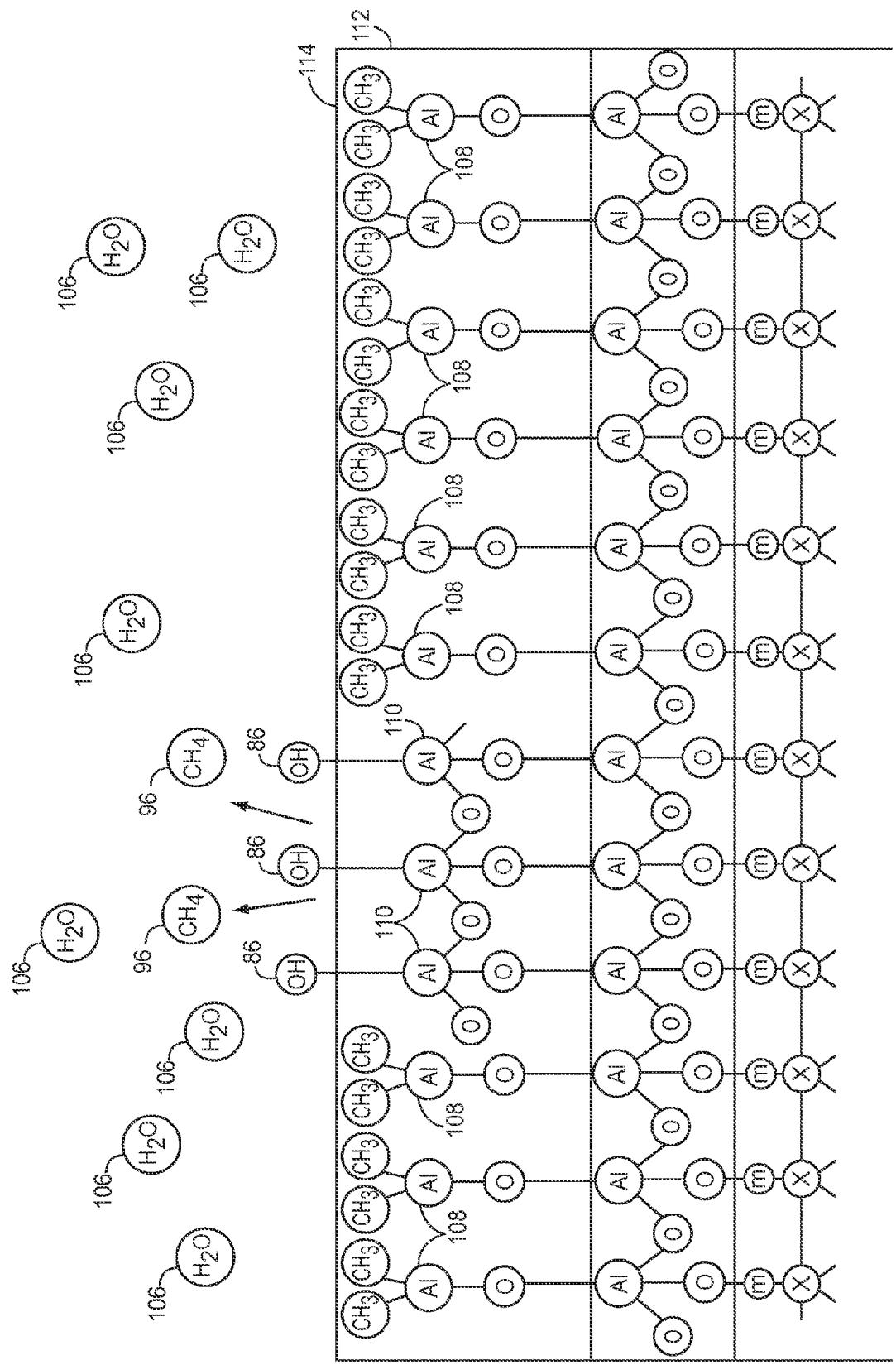
Figure 5M:
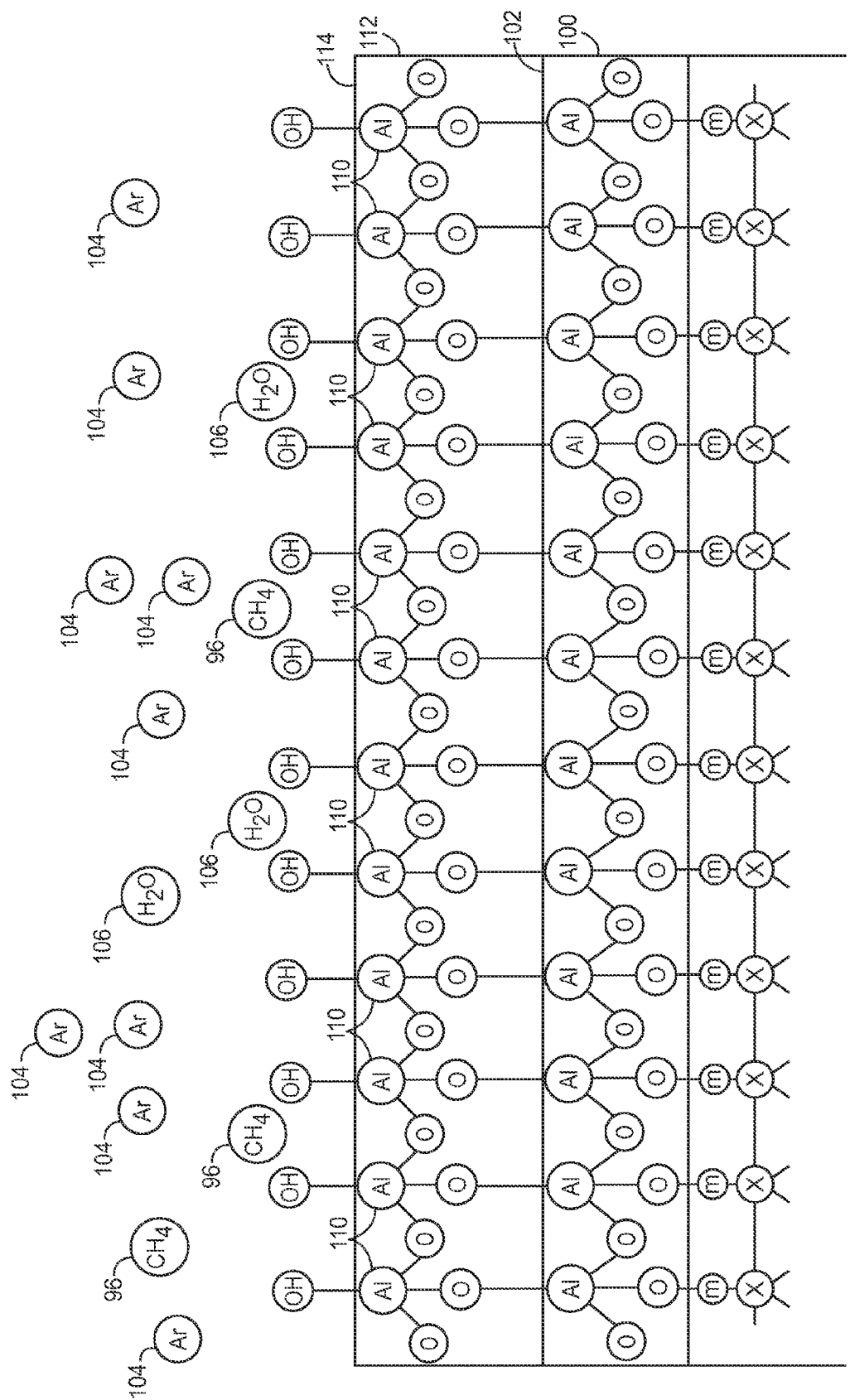
Figure 5N:
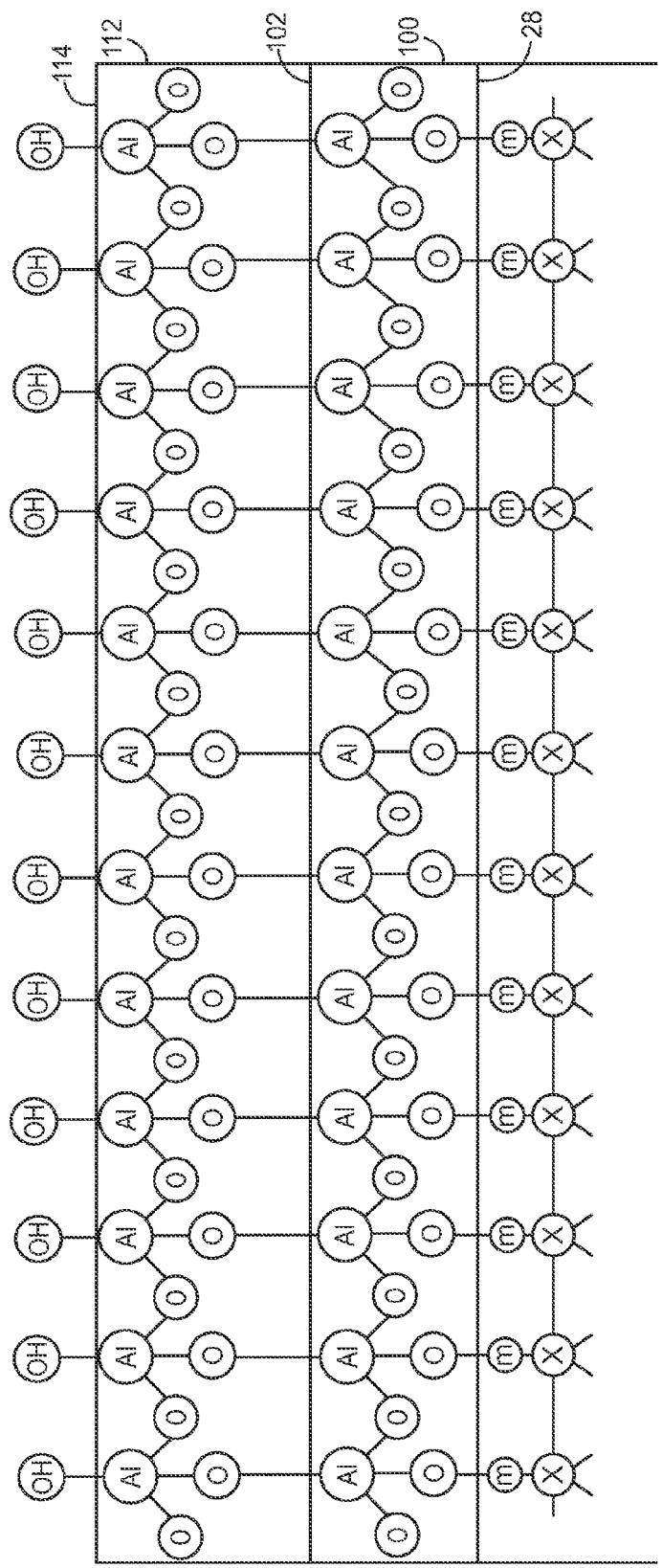

FIGS. 5A-5N illustrates steps for one embodiment of the ALD process. Note that FIGS. 5A-5N are simply illustrative and additional steps or different steps may be utilized to implement the ALD process, as shall be recognized by those of ordinary skill in the art in light of this disclosure. Also, FIGS. 5A-5N show molecular representations of the materials and reactants involved in the ALD process. The molecular representations are not to scale and are merely illustrative. For example, the principles of quantum mechanics, such as Heisenberg's uncertainty principle and wave-particle duality, teaches that the position and momentum of a particle cannot be known to an arbitrarily high precision and thus representing molecules as positioned at a particular position is a simplification. However, the molecular representations in FIGS. 5A-5N are not intended to accurately depict molecules or molecular relationships but rather the depictions are simply provided to help illustrate steps and concepts related to the ALD process in this disclosure. With that cautionary note to the reader, molecules and atoms are represented in FIGS. 5A-5N by spheres while lines connecting the spheres represent covalent or ionic bonds between the atoms or molecules.

FIG. 5A represents a segment 85 of the power amplifier 10 at the surface 28 prior to forming the film 26 on the power amplifier 10. While the processes described in FIGS. 5A-5N may take place along the entirety of the surface 28 of the power amplifier 10, the segment 85 of the surface 28 is illustrated for practical reasons and for the purposes of clarity. The segment 85 illustrated in FIGS. 5A-5N may be any section of the surface 28 and thus molecules 88 of the power amplifier 10 at the surface 28 are labeled X because the type of material at the surface 28 may vary in accordance with the material of a particular section of the power amplifier 10 at the surface 28. For example, the segment 85 represents a section of the surface 28 of the semiconductor die 12 and the semiconductor die 12 may include different types of materials along the surface 28, such as the surface of the semiconductor substrate or a metallic layer, similar to the power amplifier 38 illustrated in FIG. 3. The molecules 88 may thus be molecules of a semiconductive material, such as (GaAs,) or of a metallic material, such as aluminum (Al), depending on which particular material is on the surface 28 at the segment 85. If the segment 85 were of the semiconductive substrate then the molecules 88 labeled X may be GaAs and the molecules 88 would be bonded to other GaAs molecules (not shown) within the semiconductor substrate. On the other hand, if the segment 85 were a segment of a metallic layer, the molecules 88 may be aluminum (Al) atoms bonded to other aluminum atoms (not shown).

While the segment 85 illustrated in FIGS. 5A-5N represents the section of the surface 28 of the power amplifier 10, in this embodiment, the power amplifier 10 has already been attached to the substrate surface 16 of the laminated substrate 14. Consequently, as shown in FIG. 2, the film 26 is formed by the processes described in FIGS. 5A-5N below covers the entire power amplification system 22. As a result, the processes described by FIGS. 5A-5N are also being performed on the surfaces 30 of the ancillary power electronic devices 24 as well as on the substrate surface 16 of the laminated substrate 14 to form the film 26 over these structures as well. Finally, processes similar to those described in FIGS. 5A-5N may be performed to form the film 60 on the surface 58 of the power amplifier 38 in FIG. 3, which unlike the power amplifier 10 in FIG. 2 has not been attached to a supporting structure.

To form the film 26, the surface 28 of the power amplifier 10 is prepared for the ALD process. Accordingly, the surface 28 of the power amplifier 10 may be hydroxylated so that hydroxyl (OH) 74 is bonded by metal molecules 92 to the molecules 88 along the surface 28 of the power amplifier 10 (FIG. 5B). This may be done by exposing the surface 28 to a metal bonded to a hydrogen containing ligand (not shown) and cleaning the surface 28. The composition of a metal bonded to a hydrogen containing ligand may depend on the particular materials used to form of the power amplifier 10. Once the surface 28 has been prepared, the hydroxyl 86 is bonded by metal molecules 92 to the molecules 88 along the surface 28 of the power amplifier 10, as shown in FIG. 4B.

Next, after preparing the surface 28 the initial layer deposition cycle of the ALD process may begin. The surface 28 may be heated to between around 50° C. and 350° C. During a first time period of the initial layer deposition cycle, the first precursor may be introduced into the reaction chamber 66, which exposes the surface 28 of the power amplifier 10 to the first precursor (FIG. 5C). In this case, the first precursor is a trimethylaluminum gas $(Al(CH_3)_3)$ 90 but may also include other reactants to assist in the reaction, if desired. The trimethylaluminum gas 90 reacts with the hydroxyl 86 to dehydroxylate the surface 28 and form methylaluminoxane $(OAl(CH_3)_2)$ 108 and methane $(CH_4)$ 96 as a byproduct. During the first time period of the initial layer deposition cycle, the trimethylaluminum gas 90 may be introduced until the surface 28 is saturated. If the reaction chamber 66 provides the surface 28 at the appropriate temperature and appropriate vacuum conditions, the reaction may self-terminate upon saturation when the hydroxyl 86 (shown in FIG. 5B) along the surface 28 of the power amplifier 10 is consumed by the reaction. The reaction may be exothermic in that the reaction chamber 66 may heat the surface 28 so that the temperature range of the surface 28 allows the reaction to go to completion but is not so high as to cause decomposition of the first precursor.

The reaction with the first precursor creates a monolayer 100 of methylaluminoxane 108 on the surface 28 of the power amplifier 10 (FIG. 5D). The methylaluminoxane 108 of the monolayer 100 is bonded to the metal molecules 92 and to the molecules 88 on the surface 28 of the power amplifier 10 through the oxygen (O) atom 94. A surface 102 of the monolayer 100 is methylated since melythium $(CH_3)$ is bonded along the surface 102.

During a second time period of the initial layer deposition cycle, the reaction chamber 66 may be purged to remove byproducts, such as methane 96 and unreacted trimethylaluminum gas 90 from the surface 102 of the monolayer 100. In this example, the reaction chamber 66 is purged by introducing an inert gas, such as an Argon gas (Ar) 104, into the reaction chamber 66. However other inert gas such as, nitrogen gas $(N_2)$, helium (He), and the like may also be utilized. The surface 102 of the monolayer 100 is exposed to the Argon gas 104, which may be heated to a decomposition temperature. The reaction chamber 66 may also be evacuated to remove the byproducts and excess trimethyaluminum gas 90. As a result, the surface 102 of the monolayer 100 is cleaned (FIG. 5E).

During a third time period of the initial layer deposition cycle, a second precursor may be introduced into the reaction chamber 66 (FIG. 5F). In this embodiment, the second precursor is made from water vapor $(H_2O)$ 106, but in the alternative, the second precursor may also be an oxygen gas $(O_2$ or $O_3)$, an oxygen plasma, an oxygen gas mixed with carbon dioxide $(CO_2)$, an oxygen plasma mixed with carbon dioxide $(CO_2)$, or the like. The methylaluminoxane 108 of the monolayer 100 reacts with the water vapor 106, which demethylates the surface 102, and forms alumina 110. A byproduct of the reaction is methane 96. The alumina 110 formed by the reaction and is bonded to hydroxyl 86. If the reaction chamber 66 provides the appropriate vacuum conditions and provides the monolayer 100 at the appropriate temperature, the reaction may self-terminate upon saturation since the methylaluminoxane 108 of the monolayer 100 has been consumed by the reaction with the water vapor 106. This reaction may also be exothermic in that the reaction chamber 66 may heat the monolayer 100 so that the temperature range of the monolayer 100 allows the reaction to go to completion but is not so high as to cause decomposition of the second precursor.

The reaction of methylaluminoxane 108 and the second precursor thus forms the monolayer 100 into a monolayer 100 of alumina 110 and hydroxylates the surface 102 of the monolayer 100 (FIG. 5G). This monolayer 100 thus forms the first layer of the film 26 over the surface 28 of the power amplifier 10. The monolayer 100 may be less than 0.1 Angstroms in thickness, since ideally the monolayer is a single molecule in thickness. Note, while the monolayer 100 is ideally a single molecule in thickness, practical considerations and non-ideal conditions may cause the monolayer 100 to be a non-ideal monolayer and have limited sections that may be a few molecules in thickness.

During a fourth time period of the initial layer deposition cycle, the reaction chamber 66 may be purged to remove byproducts, such as methane 96 and unreacted water vapor 106 from the surface 102 of the monolayer 100. The surface 102 of the monolayer 100 may be purged by being exposed to the Argon gas 104 and by another evacuation of the reaction chamber 66. This again cleans the surface 102 of the monolayer 100 (FIG. 5H). This monolayer 100 can then be cured and cleaned again after curing, if desired.

The subsequent layer deposition cycle may now begin. As discussed above, the surface 102 of the monolayer 100 has been hydroxylated and provides hydroxyl 86 along the surface 102 of the monolayer 100. The surface 28 may be heated to between about 50° C.-350° C. During a first time period of the next layer deposition cycle, the surface 102 of the monolayer 100 may be exposed to the first precursor which as discussed above, the first precursor is or includes trimethyaluminum gas 90. (FIG. 5I). The trimethylaluminum gas 90 reacts with the hydroxyl 86 to dehydroxylate the surface 102 and form methylaluminoxane $(OAl(CH_3)_2)$ 108 and methane $(CH_4)$ 96 as a byproduct. During the first time period of the subsequent layer deposition cycle, the trimethylaluminum gas 90 may be introduced until the surface 102 of the monolayer 100 is saturated. If the reaction chamber 66 provides the surface 102 at the appropriate temperature and appropriate vacuum conditions, the reaction may self-terminate upon saturation when the hydroxyl 86 (shown in FIG. 5H) along the surface 28 of the power amplifier 10 is consumed by the reaction. The reaction may be exothermic in that the reaction chamber 66 may heat the surface 102 so that the temperature range of the surface 102 allows the reaction to go to completion but is not so high as to cause decomposition of the first precursor.

The trimethyaluminum gas 90 reacts with the surface 102 of the monolayer 100 to form methylaluminoxane 108. The surface 102 of the monolayer 100 is thus dehydroxylated and the reaction produces methane ($CH_4$) 96 as a byproduct. During the first time period of this layer deposition cycle, the trimethyaluminum gas 90 may be introduced until the monolayer 100 is saturated. Accordingly, another monolayer 112 of the methylaluminoxane 108 is created over the surface 102 of the earlier formed monolayer 100 (FIG. 5J). The methylaluminoxane 108 of the monolayer 112 is bonded to the alumina 110 of the earlier formed monolayer 100 through the oxygen atom 94. A surface 114 of the monolayer 112 is methylated since melythium is bonded along the surface 114 of the monolayer 112. Next, during a second time period of the layer deposition cycle, the reaction chamber 66 may be purged to remove byproducts, such as methane 96 and unreacted trimethyaluminum gas 90 from the surface 114 of the monolayer 112 by exposing the surface 114 to the inert gas, which in this example is Argon gas 104 that has been heated to the decomposition temperature. The reaction chamber 66 may also be evacuated during the second time period to remove the byproducts and excess trimethyaluminum gas 90 from the surface 102. In this manner, the surface 114 of the monolayer 112 is cleaned (FIG. 5K).

During a third time period of the layer deposition cycle, the second precursor may be introduced into the reaction chamber 66 (FIG. 5L). The water vapor 106 of the second precursor reacts with the methylaluminoxane 108 of the monolayer 112 which alumina 110 and demethylates the surface 114 and a byproduct of the reaction is methane 96. The alumina 110 formed in the monolayer 112 is also bonded to the hydroxyl 86. The reaction of the methylaluminoxane 108 and the second precursor thus forms the monolayer 112 into the monolayer 112 of alumina 110 (FIG. 5M). During the third time period of the layer deposition cycle, the water vapor ($H_2O$) 106 may be introduced until the monolayer 112 is saturated and the monolayer 112 is transformed into the monolayer 112 of alumina 110 having the surface 114 that is hydroxylated. The reaction may be exothermic in that the reaction chamber 66 may heat the monolayer 112 so that the temperature range of the monolayer 112 allows the reaction to go to completion but is not so high as to cause decomposition of the second precursor. Thus, this layer deposition cycle forms another monolayer 112 of alumina 110 in the film 26 on the surface 102 of the earlier formed monolayer 100.

During a fourth time period of the layer deposition cycle, the reaction chamber 66 may be purged to remove byproducts, such as methane 96 and unreacted water vapor 106 from the surface 114 of the monolayer 112 by introducing the inert gas, which in this case is Argon gas 104 that has been heated to a decomposition temperature. The reaction chamber 66 may also be evacuated during the fourth time period to remove the byproducts and excess water vapor 106 from the surface 102. In this manner, the surface 114 of the monolayer 112 is cleaned and the surface 114 is hydroxylated to form the next monolayer (FIG. 5N). The monolayer 112 may then be cured and cleaned again, if desired.

Referring again to FIGS. 2, 4, and 5A-5N, subsequent deposition cycles can repeat the steps described above in FIGS. 5I-5N to form and stack additional monolayers over the surface 28 of the power amplifier 10. As shown by the formation of the monolayer 100 of alumina 110 in FIGS. 5C-5H and the formation of the monolayer 112 of alumina 110 in FIGS. 5I-5N, the ALD process may divide the formation of each monolayer 100, 112 into two self-terminating surface reactions, one surface reaction with the first precursor having the trimethyaluminum gas 90 (FIG. 5C and FIG. 5I) and another surface reaction with the second precursor, which in this case is the water vapor 106 (FIG. 5F and FIG. 5L). If the alumina 110 were simply sputtered onto the surface 28 or formed by a single reaction, like in sputtering deposition processes and CVD processes, then excessive amounts of material would be formed on the surface 28 since the amount of material deposited would be dependent on the accuracy of the control device 76 in providing precise amounts of material or reactants within the reaction chamber 66. However, by dividing the formation of each of the monolayers 100, 112 into two surface reactions, the amounts of each precursor provided into the reaction chamber 66 may have little or no effects on the amount of alumina 110 formed assuming the appropriate conditions and are provided within the reaction chamber 66.

The self-limiting reactions of the first precursor and the second precursor self-terminate upon saturation thereby allowing the monolayers 100, 112 of alumina to be formed. Accordingly, the ALD process may be less sensitive to the flux uniformity of each of the precursors into the reaction chamber 66. Instead, lack of flux uniformity into the reaction chamber 66 simply results in different completion times along different areas and provides sufficient time for the monolayers 100, 112 to still form with high precision.

Also, the first precursor and the second precursor may be gases, such as the trimethyaluminum gas 90 and the water vapor 106, respectively, which can easily flow into areas that have high aspect ratios which are the screen shadow areas 36 in FIG. 2 and the shadow areas 61 in FIG. 3. The ALD process can thus provide a uniform and conformal film 26 or film 60 on shadow areas 36 and shadow areas 61 even when the surface 28 and the surface 58 (shown in FIG. 3) have high aspect ratios. Thus, this allows for the film 26 and the film 60 to be uniform and substantially devoid of pinholes, and voids to adequately protect the power amplification system 22, the power amplifier 10, and the power amplifier 38 (shown in FIG. 3) from environmental conditions.

Note that FIGS. 5A-5N describe each layer deposition cycle as depositing a single monolayer 100, 112 per layer deposition cycle. In the alternative, multiple monolayers may be provided per layer deposition cycle by repeating the steps described above in FIGS. 5I-5N during additional time periods of each one of the layer deposition cycle. For example, after the first through fourth time periods of the layer deposition cycle described in FIGS. 5I-5N, the steps described in FIGS. 5I-5N may be repeated during a fifth through an eight time period of the layer deposition cycle to form another monolayer. This can be done repeatedly throughout the length of the layer deposition cycle. One layer deposition cycle may deposit from about 1 to 400 monolayers of the film 26 and thus provide a layer of the film 26 from a monolayer up to a molecular layer of about 400 molecules in thickness. After each layer deposition cycle, the molecular layer is cured and additional molecular layers may be provided over the surface 28 during subsequent layer deposition cycles. Currently, layer deposition cycles may be from around 0.5 seconds to several seconds, depending on the desired thickness of the molecular layer provided per layer deposition cycle and the equipment being used to create the molecular layer. To form molecular layers, the layer deposition cycles may be divided into pulse sequences of the first precursor, second precursor, and inert gas in which the time periods described above for FIGS. 5I-5N may be continuously repeated during other time periods of the layer deposition cycle. After each of the layer deposition cycles, the molecular layers formed by the layer deposition cycle may be allowed to cure.

Also, while FIGS. 5A-5N illustrate the segment 85 of the surface 28 of the power amplifier 10, the power amplifier 10 has been attached on the substrate surface 16 of the laminated substrate 14 and the ALD process is being performed so that the film 26 is formed to cover the power amplification system 22, as illustrated in FIG. 2. Thus, exposing the surface 28 of the power amplifier 10 to the first precursor and to the second precursor also exposes the laminated substrate 14 to the first precursor and the second precursor to form the first monolayer 100, second monolayer 112, and any additional monolayers, over the substrate surface 16 and the film 26 covers the power amplification system 22.

Those skilled in the art will recognize improvements and modifications to the preferred embodiments of the present disclosure. All such improvements and modifications are considered within the scope of the concepts disclosed herein and the claims that follow.

What is claimed is:

1. A method of coating a surface of a power amplifier, comprising:
    exposing the power amplifier to a first precursor, the first precursor comprising a trimethyaluminum gas that reacts with the surface of the power amplifier to form a first monolayer of methylaluminoxane over the surface of the power amplifier; and
    exposing the first monolayer to a second precursor that reacts with the methylaluminoxane of the first monolayer so that the first monolayer comprises alumina.

2. The method of claim 1 wherein the second precursor comprises water vapor.

3. The method of claim 1 further comprising after exposing the power amplifier to the first precursor but before exposing the first monolayer to the second precursor, cleaning a surface of the first monolayer.

4. The method of claim 3 further comprising after exposing the first monolayer to the second precursor, again cleaning the surface of the first monolayer.

5. The method of claim 1 wherein, after exposing the first monolayer to the second precursor, the first monolayer has a surface that is hydroxylated.

6. The method of claim 5 further comprising:
    exposing the first monolayer to the first precursor, which reacts with the surface of the first monolayer to form a second monolayer comprising methylaluminoxane over the first monolayer; and
    exposing the second monolayer to the second precursor, which reacts with the methylaluminoxane of the second monolayer so that the second monolayer comprises alumina and has a surface that is hydroxylated.

7. The method of claim 6 further comprising:
    cleaning the surface of the first monolayer after exposing the power amplifier to the first precursor but before exposing the first monolayer to the second precursor; and
    again, cleaning the surface of the first monolayer after exposing the first monolayer to the second precursor but before exposing the first monolayer to the first precursor.

8. The method of claim 7 further comprising cleaning the surface of the second monolayer after exposing the first monolayer to the first precursor but before exposing the second monolayer to the second precursor.

9. The method of claim 1 further comprising hydroxylating the surface of the power amplifier prior to exposing the power amplifier to the first precursor.

10. The method of claim 1 wherein the power amplifier is formed in a semiconductor die.

11. The method of claim 10 wherein the semiconductor die comprises:
    the surface of the power amplifier;
    a metallic layer; and
    a semiconductor substrate, wherein the surface of the power amplifier comprises a surface of the semiconductor substrate and a surface of the metallic layer.

12. The method of claim 1, further comprising heating the surface of the power amplifier.

13. The method of claim 1 wherein after exposing the first monolayer to the second precursor, the first monolayer is less than 0.1 Angstroms in thickness.

14. The method of claim 1 wherein the power amplifier is attached on a laminated substrate.

15. A method of forming a film of a plurality of monolayers on a surface of a power amplifier, comprising:
    providing the power amplifier within a reaction chamber;
    implementing a plurality of layer deposition cycles within the reaction chamber to form the plurality of monolayers of the film, wherein each of the plurality of layer deposition cycles, comprises:
        introducing a first precursor within the reaction chamber during a first time period to form one of the plurality of monolayers wherein the first precursor comprises a trimethyaluminum gas and the one of the plurality of monolayers comprises methylaluminoxane; and
        introducing a second precursor within the reaction chamber during a second time period, the second precursor reacting with the methylaluminoxane so that the one of the plurality of monolayers comprises alumina and a surface that is hydroxylated.

16. The method of claim 15 wherein, after implementing the plurality of layer deposition cycles within the reaction chamber to form the film, the film has a thickness greater than or equal to about 50 Angstroms but less than or equal to about 300 Angstroms.

17. The method of claim 15 further comprising hydroxylating the surface of the power amplifier prior to implementing the plurality of layer deposition cycles within the reaction chamber.

18. The method of claim 17 wherein implementing the plurality of layer deposition cycles within the reaction chamber to form the plurality of monolayers of the film comprises:
    wherein for an initial one of the plurality of layer deposition cycles, the initial one of the plurality of deposition cycles comprises:
        introducing the first precursor within the reaction chamber during the first time period to form the one of the plurality of monolayers for the initial one of the plurality of layer deposition cycles on the surface of the power amplifier;
        introducing the second precursor within the reaction chamber during the second time period for the initial one of the plurality of layer deposition cycles comprises the second precursor reacting with the methylaluminoxane of the one of the plurality of monolayers for the initial one of the plurality of layer deposition cycles so that the one of the plurality of monolayers for the initial one of the plurality of layer deposition cycles comprises alumina and a surface that is hydroxylated;
    wherein each one of the other layer deposition cycles after the initial one of the plurality of layer deposition cycles comprises:

introducing the first precursor within the reaction chamber during the first time period to form the one of the plurality of monolayers for the one of the other layer deposition cycles on the surface of the one of the plurality of monolayers formed during an earlier one of the plurality of layer deposition cycles; and introducing the second precursor within the reaction chamber during the second time period for the one of the other layer deposition cycles comprises the second precursor reacting with the methylaluminoxane of the one of the plurality of monolayers for the one of the other layer deposition cycles so that the one of the plurality of monolayers for the one of the other layer deposition cycles comprises alumina and a surface that is hydroxylated.

19. The method of claim 16 wherein for at least one of the plurality of layer deposition cycles, the at least one of the plurality of layer deposition cycles comprises repeatedly introducing the first precursor within the reaction chamber and introducing the second precursor within the reaction chamber during other time periods of the at least one of the of the plurality of layer deposition cycles to form other ones of the plurality of monolayers of the film during the at least one of the plurality of layer deposition cycles, such that the at least one of the plurality of layer deposition cycles forms a molecular layer of the film.

20. The method of claim 16 wherein each of the plurality of layer deposition cycles further comprises purging the reaction chamber during a third time period, the third time period being after the first time period but before the second time period.

21. The method of claim 20 wherein each of the plurality of layer deposition cycles further comprises purging the reaction chamber during a fourth time period, the fourth time period being after the second time period.

22. The method of claim 16 wherein each of the plurality of layer deposition cycles further comprises evacuating the reaction chamber during a third time period, the third time period being after the first time period but before the second time period.

23. The method of claim 22 wherein each of the plurality of layer deposition cycles further comprises evacuating the reaction chamber during a fourth time period, the fourth time period being after the second time period.

24. The method of claim 16 wherein after implementing a plurality of layer deposition cycles within the reaction chamber to form the film, the film has a thickness greater than or equal to about 50 Angstroms but less than or equal to about 300 Angstroms.

25. The method of claim 15 wherein providing the power amplifier within the reaction chamber comprises providing a laminated substrate within the reaction chamber, the laminated substrate having a substrate surface and the power amplifier being attached on the substrate surface.

26. A method of coating a film over a laminated substrate, comprising:

providing the laminated substrate, the laminated substrate having a substrate surface and a power amplifier circuit attached on the substrate surface;

exposing the laminated substrate to a first precursor that comprises a trimethyaluminum gas to form a first monolayer of methylaluminoxane over the substrate surface which covers the power amplification circuit; and exposing the first monolayer to a second precursor that reacts with the methylaluminoxane of the first monolayer so that the first monolayer comprises alumina.

27. The method of claim 26 wherein the power amplifier circuit comprises a power amplifier and one or more ancillary power amplification circuits.

28. The method of claim 26 further comprising, after exposing the laminated substrate to the first precursor but before exposing the first monolayer to the second precursor, cleaning a surface of the first monolayer.

\* \* \* \* \*